United States Patent
Auernhammer et al.

(10) Patent No.: US 12,020,066 B2
(45) Date of Patent: Jun. 25, 2024

(54) ASYNCHRONOUS COMPLETION NOTIFICATION IN A MULTI-CORE DATA PROCESSING SYSTEM

(71) Applicant: INTERNATIONAL BUSINESS MACHINES CORPORATION, Armonk, NY (US)

(72) Inventors: Florian Auernhammer, Rueschlikon (CH); David A. Shedivy, Rochester, MN (US); Daniel Wind, Nice Meridia (FR); Wayne Melvin Barrett, Rochester, MN (US)

(73) Assignee: International Busin ess Machines Corporation, Armonk, NY (US)

( * ) Notice: Subject to any disclaimer, the term of this patent is extended or adjusted under 35 U.S.C. 154(b) by 481 days.

(21) Appl. No.: 17/345,833

(22) Filed: Jun. 11, 2021

(65) Prior Publication Data

US 2022/0398130 A1 Dec. 15, 2022

(51) Int. Cl.
| | |
|---|---|
| G06F 9/48 | (2006.01) |
| G06F 9/54 | (2006.01) |
| G06F 12/0875 | (2016.01) |
| G06F 30/333 | (2020.01) |
| G06F 9/52 | (2006.01) |

(52) U.S. Cl.
CPC ............ *G06F 9/4881* (2013.01); *G06F 9/542* (2013.01); *G06F 9/544* (2013.01); *G06F 12/0875* (2013.01); *G06F 30/333* (2020.01); *G06F 9/522* (2013.01); *G06F 2212/1008* (2013.01)

(58) Field of Classification Search
None
See application file for complete search history.

(56) References Cited

U.S. PATENT DOCUMENTS

| | | | |
|---|---|---|---|
| 4,350,058 A | 9/1982 | Miller | |
| 6,907,605 B1* | 6/2005 | Ault | G06F 9/542 718/100 |
| 8,255,913 B2* | 8/2012 | Arimilli | G06F 9/542 718/103 |

(Continued)

OTHER PUBLICATIONS

Ahmad et al., "vIC: Interrupt Coalescing For Virtual Machine Storage Device IO," USENIXATC'11: Proceedings of the 2011 USENIX conference, Jun. 2011, 4 pages.

(Continued)

*Primary Examiner* — Abu Zar Ghaffari
(74) *Attorney, Agent, or Firm* — Brian F. Russell; Randy Tejeda

(57) ABSTRACT

Asynchronous completion notification is provided in a data processing system including one or more cores each executing one or more threads. A hardware unit of the data processing system receives and enqueues a request for processing and a source tag indicating at least a thread and core that issued the request. The hardware unit maintains a pointer to a completion area in a memory space. The completion area includes a completion granule for the hardware unit and thread. The hardware unit performs the processing requested by the request and computes an address of the completion granule based on the pointer and the source tag. The hardware unit then provides completion notification for the request by updating the completion granule with a value indicating a completion status.

20 Claims, 5 Drawing Sheets

(56) References Cited

U.S. PATENT DOCUMENTS

| | | | |
|---|---|---|---|
| 8,972,642 | B2 | 3/2015 | Venkumahanti |
| 9,009,377 | B2 | 4/2015 | Machnicki |
| 9,116,869 | B2 | 8/2015 | Madukkarumukumana |
| 9,378,047 | B1 | 6/2016 | Gould |
| 9,678,901 | B2 | 6/2017 | Arndt et al. |
| 9,727,503 | B2 * | 8/2017 | Kagan ............... G06F 13/28 |
| 9,904,638 | B2 | 2/2018 | Arndt et al. |
| 10,229,075 | B2 | 3/2019 | Arndt |
| 10,423,550 | B2 | 9/2019 | Arndt |
| 10,545,892 | B2 | 1/2020 | Adachi |
| 10,552,351 | B2 | 2/2020 | Auernhammer |
| 10,572,411 | B2 | 2/2020 | Accapadi |
| 10,579,416 | B2 | 3/2020 | Jaloma |
| 10,606,750 | B1 * | 3/2020 | Mattina ............... G06F 12/122 |
| 10,614,006 | B2 | 4/2020 | Bshara |
| 10,649,823 | B2 | 5/2020 | Dodge et al. |
| 10,783,000 | B2 | 9/2020 | Nassi et al. |
| 10,831,539 | B2 | 11/2020 | Accapadi |
| 10,996,990 | B2 | 5/2021 | Makineedi |
| 2003/0023775 | A1 * | 1/2003 | Blackmore ............ G06F 9/544 |
| | | | 719/330 |
| 2003/0093578 | A1 * | 5/2003 | Minnick ............... G06F 13/128 |
| | | | 719/318 |
| 2003/0133464 | A1 | 7/2003 | Marejka |
| 2006/0212607 | A1 * | 9/2006 | Riethmuller ............ G06F 13/24 |
| | | | 710/6 |
| 2007/0174509 | A1 * | 7/2007 | Day ..................... G06F 13/28 |
| | | | 710/22 |
| 2009/0031325 | A1 * | 1/2009 | Archer ................ G06F 9/544 |
| | | | 719/315 |
| 2009/0199182 | A1 * | 8/2009 | Arimilli ............... G06F 9/544 |
| | | | 718/100 |
| 2010/0082867 | A1 | 4/2010 | Adachi |
| 2011/0125948 | A1 * | 5/2011 | Takeuchi ............ G06F 13/364 |
| | | | 710/113 |
| 2011/0271151 | A1 * | 11/2011 | Stevens .................. G06F 13/42 |
| | | | 714/50 |
| 2012/0260261 | A1 * | 10/2012 | Tillier ..................... G06F 9/547 |
| | | | 719/313 |
| 2014/0108691 | A1 | 4/2014 | Kennedy |
| 2015/0248311 | A1 * | 9/2015 | Bradbury ............... G06F 9/542 |
| | | | 711/147 |
| 2015/0268988 | A1 | 9/2015 | Declercq |
| 2018/0285293 | A1 * | 10/2018 | Dykema ............... G06F 9/4812 |
| 2019/0012278 | A1 * | 1/2019 | Sindhu .................. G06F 9/546 |
| 2019/0087222 | A1 | 3/2019 | Bhandari |
| 2019/0102235 | A1 * | 4/2019 | Dodge ................... H04L 67/55 |
| 2019/0138472 | A1 | 5/2019 | Dusanapudi |
| 2019/0340019 | A1 * | 11/2019 | Brewer ................ G06F 9/542 |
| 2019/0340155 | A1 | 11/2019 | Brewer |
| 2019/0370198 | A1 | 12/2019 | Arndt |
| 2020/0125395 | A1 | 4/2020 | Accapadi |
| 2020/0167176 | A1 | 5/2020 | Arroyo |
| 2020/0301765 | A1 * | 9/2020 | Vary ..................... G06F 9/52 |
| 2020/0341921 | A1 | 10/2020 | Neiger |
| 2021/0072995 | A1 | 3/2021 | Kallam |
| 2021/0081234 | A1 | 3/2021 | Liu |
| 2021/0089481 | A1 | 3/2021 | Arakji |
| 2021/0096901 | A1 | 4/2021 | Xia |

OTHER PUBLICATIONS

Feng et al., "Certifying Low-Level Programs With Hardware Interrupts And Preemptive Threads," ACM SIGPLAN Notices, vol. 43, Issue 6, Jun. 2008, pp. 170-182.

Horst et al., "Quantifying The Latency And Possible Throughput of External Interrupts on Cyber-Physical Systems," CPS-IoT Bench'20, Sep. 25, 2020, London, UK, 7 pages.

Lee, J. et al., "Interrupt Handler Migration and Direct Interrupt Scheduling For Rapid Scheduling of Interrupt-Driven Tasks," ACM Transactions on Embedded Computing Systems, vol. 9, No. 4, Article 42, Mar. 2010, 34 pages.

Regehr et al., "Interrupt Verification Via Thread Verification," Electronic Notes in Theoretical Computer Science 174 (2007) pp. 139-150.

Efficient Asynchronous Memory Copy Operations on Multi-Core Systems and I/OAT, Vaidyanathan, K et al.; 2007.

Asynchronous Completion Token, Schmidt, DC et al.; 1999.

Asynchronous Completion Token—An Object Behavioral Pattern for Efficient Asynchronous Event Handling, Harrison, TH et al.; 1998-1999.

ip.com: Software for Verifying Input/Output Processing, Kakulamam, LNR et al.; Dec. 8, 2008.

ip.com: Parallel Debugger Architecture for Multi-Core Embedded Systems, Anonymously; Oct. 22, 2010.

ip.com: A New Methodology for the Nodejs Performance Optimization on Multi-Core System, Anonymously, Jan. 8, 2015.

ip.com: Method for Multiple Event Queues in a Channel Adapter for Efficient Distribution of Events on Multiprocessor Systems, Anonymously; Mar. 17, 2004.

Sá, Bruno & Martins, Jose & Pinto, Sandro. (2021). A First Look at RISC-V Virtualization from an Embedded Systems Perspective, 11 pages.

J. Jann, P. Mackerras, J. Ludden, M. Gschwind, W. Ouren, S. Jacobs, B. F. Veale, and D. Edelsohn. 2018. IBM POWER9 system software. IBM J. Res. Dev. 62, Jul. 4-5/Sep. 2018, 6:1-6:10. https://doi.org/10.1147/JRD.2018.2846959.

Jupyung Lee and Kyu Ho Park. 2010. Interrupt handler migration and direct interrupt scheduling for rapid scheduling of interrupt-driven tasks. ACM Trans. Embed. Comput. Syst. 9, 4, Article 42 (Mar. 2010), 34 pages. https://doi.org/10.1145/1721695.1721708.

Smith, S., "P9 Xive Exploitation." https://open-power.github.io/skiboot/doc/xive.html, 15 pages.

Tu et al., "A Comprehensive Implementation and Evaluation of Direct Interrupt Delivery," ACM Sigplan Notices, 50(7), 2005, pp. 1-15.

Wu et al., "VT-d Posted Interrupts," Intel Corporation, 17 pages.

F. Auernhammer and R. L. Arndt, "XIVE: External interrupt virtualization for the cloud infrastructure," in IBM Journal of Research and Development, vol. 62, No. 4/5, p. 5:1-5:10, Jul. 1-Sep. 2018, doi: 10.1147/JRD.2018.2845599.

* cited by examiner

ASYNCHRONOUS COMPLETION NOTIFICATION IN A MULTI-CORE DATA PROCESSING SYSTEM

BACKGROUND OF THE INVENTION

The present disclosure is generally directed to data processing systems and, more specifically, to asynchronous completion notification in a data processing system.

Data processing systems commonly include one or more processor cores to perform general-purpose processing under the direction of software, as well as various additional hardware units designed to perform one or more specific processing tasks. For example, FIG. 6 depicts a conventional data processing system 600 including multiple cores 602a, 602b, each of which can concurrently execute one or more hardware threads of execution 604a, 604b. Data processing system 600 additionally includes a hardware unit 606 communicatively coupled to cores 602a, 602b, for example, via an unillustrated system bus. Hardware unit 606 implements a limited number of instances of a resource 612 (e.g., a cache or a request processing element) for performing an asynchronous processing operation based on requests received from threads 604a, 604b.

In order to arbitrate access to the limited resource 612 between threads 604a, 604b, hardware unit 606 implements an associated hardware lock register 608. In one implementation, in order for a thread 604a to initiate access to resource 610, thread 604a must first obtain a lock by reading hardware lock register 608 in an unlocked state (e.g., x00), which atomically changes the lock register state to locked state (e.g. xFF). After obtaining the lock, thread 604a is permitted to write a command and/or data to a resource register 610 to invoke the desired processing by resource 612. Upon completion of the processing, resource 612 updates resource register 610 with a value indicating completion of the processing. While resource 612 is performing the processing, thread 604a polls resource register 610 to detect completion of processing. Upon signaling completion of processing in response to a completion poll from thread 604a, resource 612 atomically resets hardware lock register 608 to the unlocked state, thus freeing the lock for acquisition by thread 604b.

The described prior art process provides a convenient technique of coordinating access to resource 612 by two threads 604. However, the present disclosure recognizes that as data processing systems scale to include a multiplicity of cores 602 and/or threads 604, the prior art process can become inefficient and expensive to scale. For example, implementation in a large scale data processing system can require significantly increasing the number of hardware lock registers 608 and deep source queuing at threads 604. Consequently, the present disclosure appreciates that it would useful and desirable to provide improved techniques of data processing, including an improved technique for a hardware unit to provide asynchronous completion notification.

BRIEF SUMMARY

In at least one embodiment, asynchronous completion notification is provided in a data processing system including one or more cores each executing one or more threads. A hardware unit of the data processing system receives and enqueues a request for processing and a source tag indicating at least a thread and core that issued the request. The hardware unit maintains a pointer to a completion area in a memory space. The completion area includes a completion granule for the hardware unit and thread. The hardware unit performs the processing requested by the request and computes an address of the completion granule based on the pointer and the source tag. The hardware unit then provides completion notification for the request by updating the completion granule with a value indicating a completion status.

DETAILED DESCRIPTION

Figure 1:
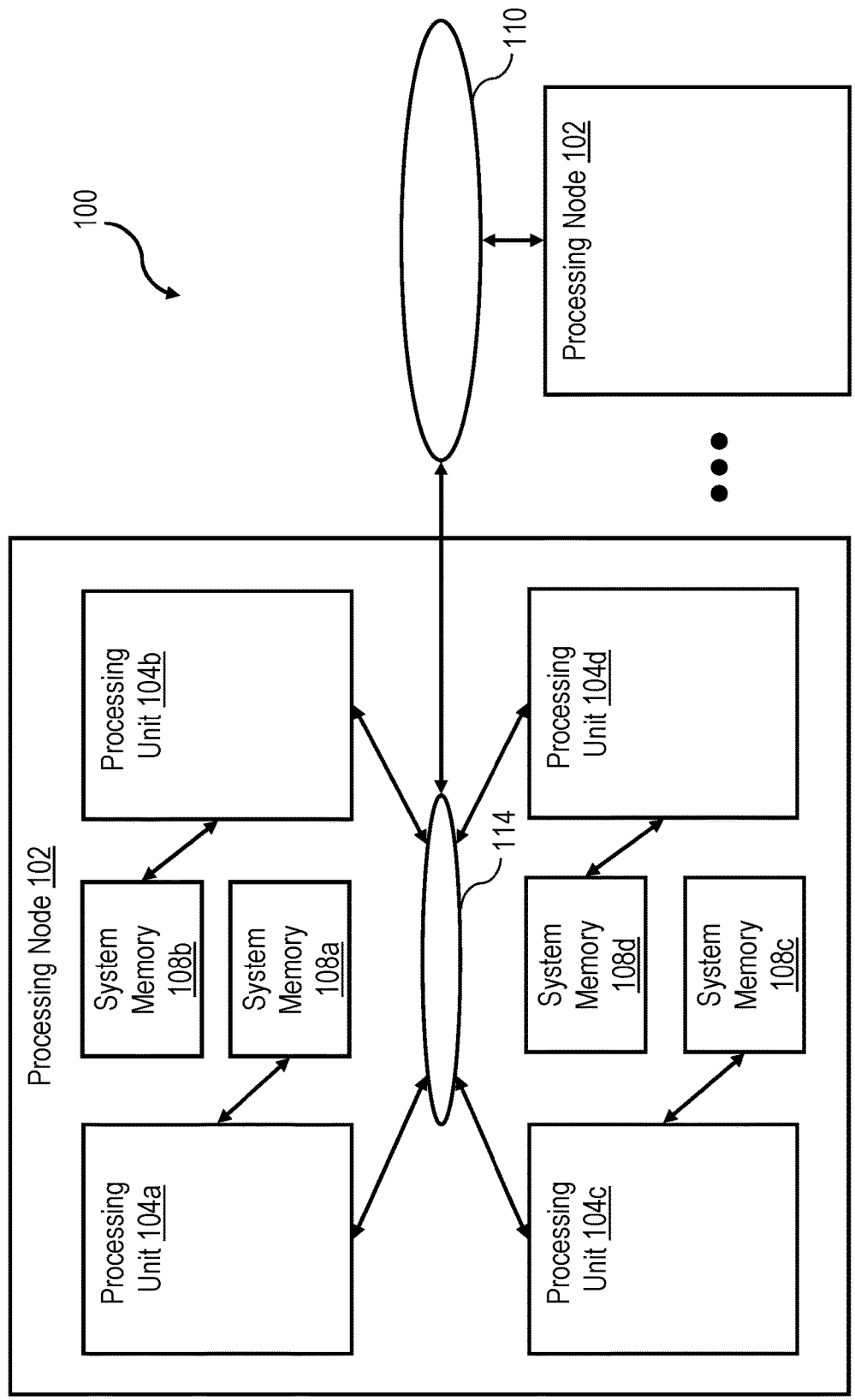
FIG. 1 is a high-level block diagram of an exemplary data processing system in accordance with one embodiment of the present disclosure.

With reference now to the figures, wherein like reference numerals refer to like and corresponding parts throughout, and in particular with reference to FIG. 1, there is illustrated a high level block diagram depicting an exemplary data processing system 100 in accordance with one or more embodiments of the present disclosure. In the depicted embodiment, data processing system 100 is a cache-coherent symmetric multiprocessor (SMP) data processing system including multiple processing nodes 102 for processing data and instructions. Processing nodes 102 are coupled to a system interconnect 110 for conveying address, data and control information. System interconnect 110 may be implemented, for example, as a bused interconnect, a switched interconnect or a hybrid interconnect.

In the depicted embodiment, each processing node 102 is realized as a multi-chip module (MCM) containing four processing units 104a-104d, each which may be realized as a respective integrated circuit. The processing units 104 within each processing node 102 are coupled for communication to each other and system interconnect 110 by a local interconnect 114, which, like system interconnect 110, may be implemented, for example, with one or more buses and/or switches. System interconnect 110 and local interconnects 114 together form a system fabric.

Processing units 104 each include a memory controller 106 (see FIG. 2) coupled to local interconnect 114 to provide an interface to a respective system memory 108. Data and instructions residing in system memories 108 can generally be accessed, cached, and modified by a processor core in any processing unit 104 of any processing node 102 within data processing system 100. System memories 108 thus form the lowest level of memory storage in the distributed shared memory system of data processing system 100. In alternative embodiments, one or more memory controllers 106 (and system memories 108) can be coupled to system interconnect 110 rather than a local interconnect 114.

Those skilled in the art will appreciate that SMP data processing system 100 of FIG. 1 can include many additional non-illustrated components, such as interconnect bridges, non-volatile storage, ports for connection to networks or attached devices, etc. Because such additional components are not necessary for an understanding of the described embodiments, they are not illustrated in FIG. 1 or discussed further herein. It should also be understood, however, that the enhancements described herein are applicable to data processing systems of diverse architectures and are in no way limited to the generalized data processing system architecture illustrated in FIG. 1.

Figure 2:
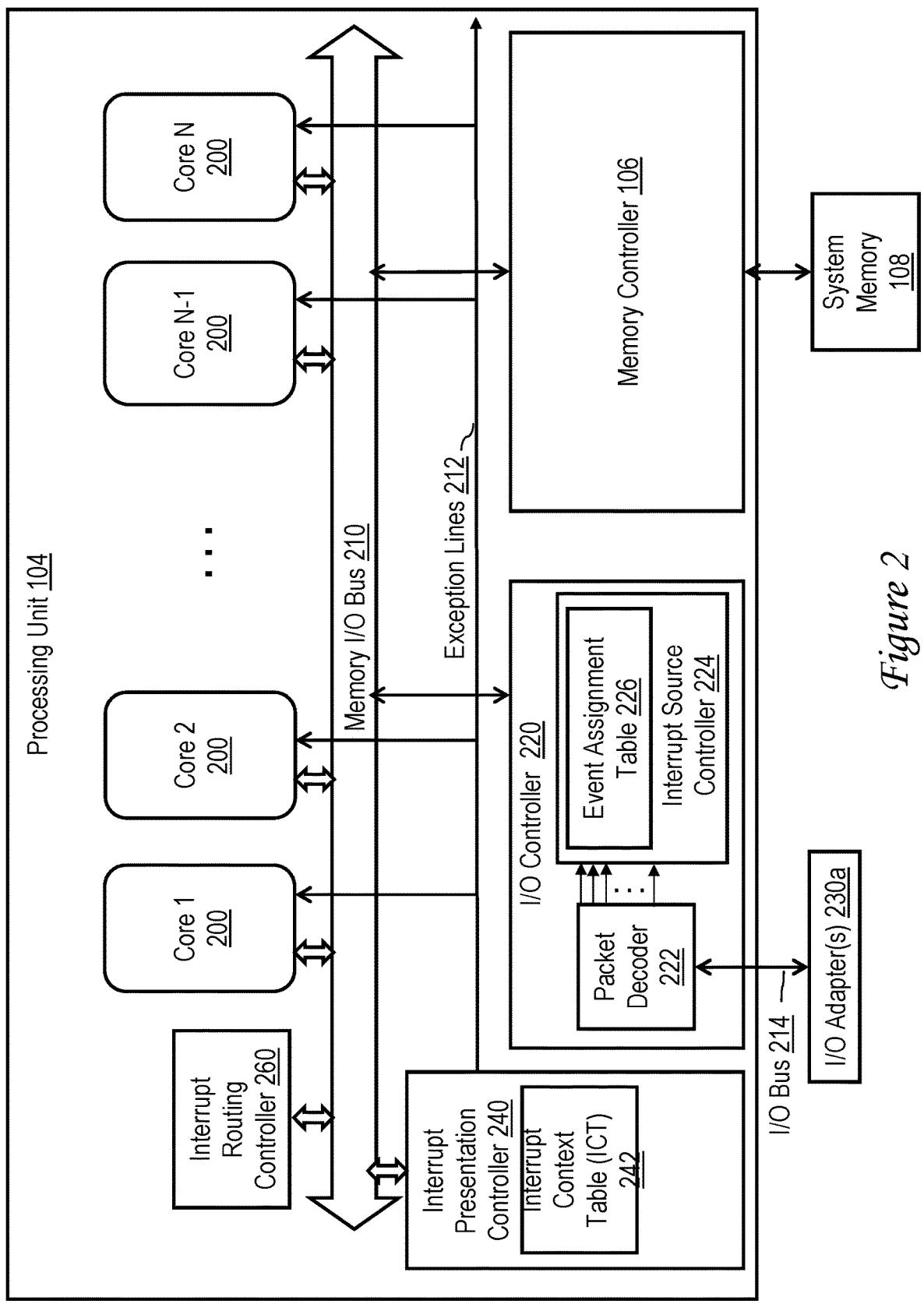
FIG. 2 is a more detailed block diagram of an exemplary processing unit in the data processing system of FIG. 1 in accordance with one embodiment of the present disclosure.

Referring now to FIG. 2, there is depicted a more detailed block diagram of an exemplary processing unit 104 in data processing system 100 of FIG. 1 in accordance with one embodiment of the present disclosure. In the depicted embodiment, each processing unit 104 is an integrated circuit including multiple processor cores 200 for processing instructions and data. In a preferred embodiment, each processor core 200 supports simultaneous multithreading (SMT) and thus is capable of independently executing multiple hardware threads of execution simultaneously.

Each processor core 200 is coupled to an interrupt presentation controller (IPC) 240 and an interrupt routing controller (IRC) 260 via memory I/O bus 210. In one or more embodiments, IPC 240 includes a single interrupt context table (ICT) 242 that maintains various information for physical processor (PP) threads of cores 200 and is employed by IPC 240 to implement hardware-based (as opposed to software-based) save and restore of virtual processor (VP) thread context in connection with interrupt handling. In one or more other embodiments, a different ICT 242 is implemented for each software stack level that can be dispatched on a PP thread. For example, a separate respective ICT 242 can be implemented for a hypervisor (Hyp) stack level, an operating system (OS) stack level, and a user stack level.

In one or more embodiments, IPC 240 is coupled to each processor core 200 via respective exception lines 212, which are utilized to notify each processor core 200 of an associated interrupt for an assigned virtual processor thread. In embodiments in which a different ICT 242 is implemented for each software stack level, different exceptions lines 212 can be implemented for each software stack level. IPC 240 is also coupled to I/O controllers 220 via memory I/O bus 210. IPC 240 is configured to receive/send information via memory I/O bus 210 from/to I/O controllers 220 and/or processor cores 200.

Each I/O controller 220 includes a packet decoder 222 and an interrupt source controller (ISC) 224 that includes an event assignment table (EAT) 226, whose values may be set via software (e.g., by a hypervisor). Each I/O controller 220 is coupled to an I/O adapter 230 via an I/O bus 214. A device or devices (not shown), e.g., disk drive, keyboard, mouse, may initiate interrupt generation by I/O controller 220 by signaling I/O adapter 230 to send a packet to packet decoder 222 of I/O controller 220 via I/O bus 214. EAT 226 includes information that I/O controller 220 uses to create event routing messages (ERMs) that are sent to IRC 260 via memory I/O bus 210. IRC 260 is configured to create event notification messages (ENMs) that are sent to IPC 240 via memory I/O bus 210. While only a single interrupt presentation controller (IPC) 240 and a single interrupt routing controller (IRC) 260 are illustrated in FIG. 2, it should be appreciated that a processing unit 104 configured according to the present disclosure may include more than one interrupt presentation controller and/or more than one interrupt routing controller.

Figure 3:
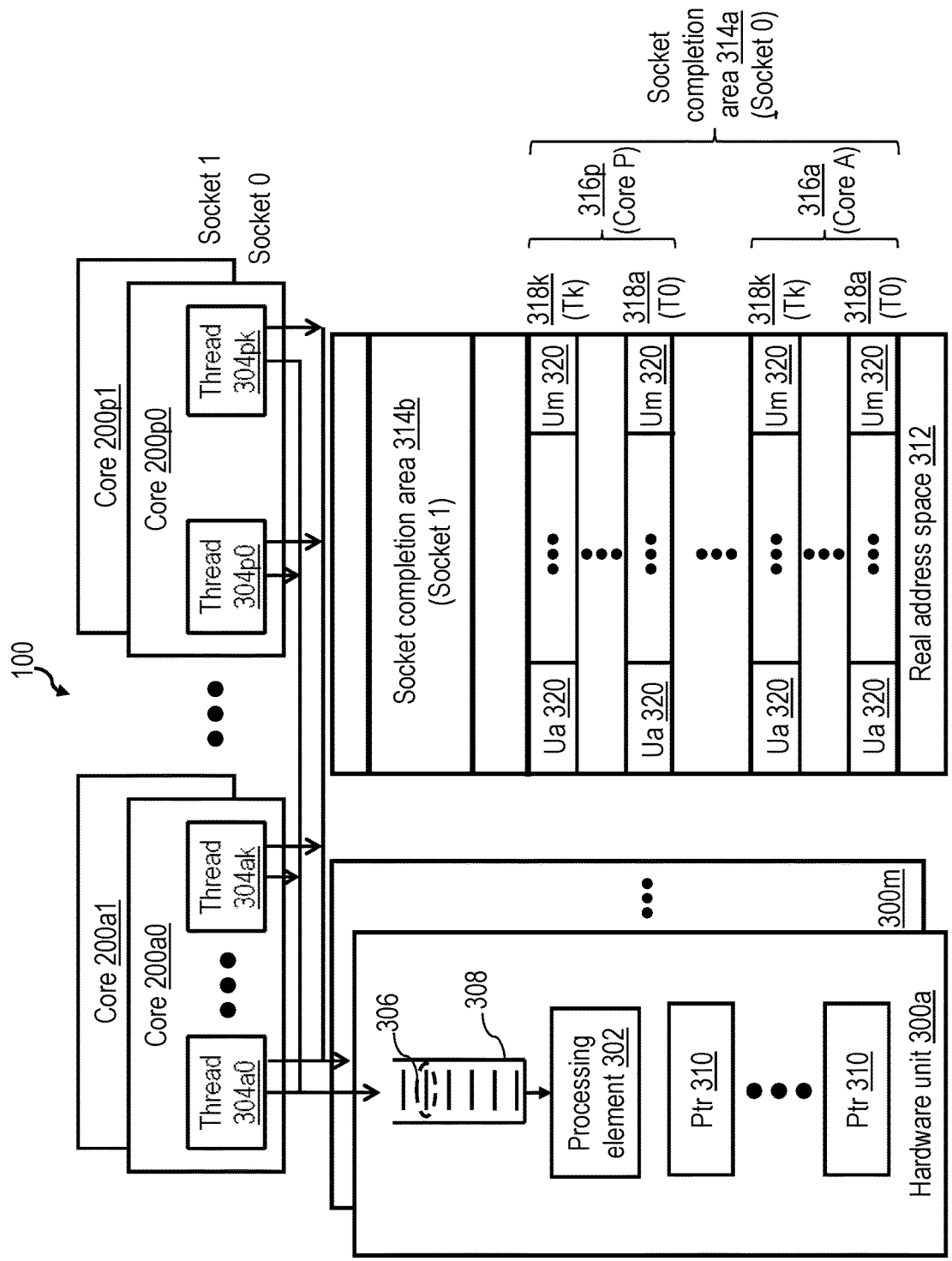
FIG. 3 is a high-level block diagram providing another view of relevant portions of the exemplary data processing system of FIG. 1 that support memory-based notification of completion of asynchronous processing in accordance with one embodiment.

With reference now to FIG. 3, there is illustrated a high-level block diagram providing another view of relevant portions of exemplary data processing system 100 that support memory-based notification of completion of asynchronous processing in accordance with one embodiment. In the example of FIG. 3, data processing system 100 includes multiple physical sockets, each hosting one or more cores 200. In particular, socket 0 includes cores 200a0-200p0, and socket 1 includes cores 200a1-200p1. Each core 200aX (where X indicates the socket number 0, 1, . . . , etc.) includes one or more physical threads 304a0 to 304ak, and each core 200pX includes one or more physical threads 304p0 to 304pk.

Cores 200 are communicatively coupled with one or more hardware units 300a-300m, each of which includes a respective processing element 302 that performs processing in response to requests (commands) 306 of one or more threads 904. The processing performed by a processing element 302 can be, for example, enforcing a barrier request or performing a cache kill request of a thread 304. In various embodiments, a hardware unit 300 as shown in FIG. 3 can be implemented, for example, with a memory controller 106, I/O controller 220, interrupt presentation controller 240, and/or interrupt routing controller 260.

As shown, requests 306 from various threads 304 that are directed to a given hardware unit 300 are received and ordered for processing in an input queue 308. In a preferred embodiment, each request 306 communicated to a hardware unit 300 and buffered in the input queue 308 includes or is associated with a source tag identifying the source of the request. For example, in embodiments including multiple sockets each capable of hosting multiple cores, the source tag preferably specifies a thread ID identifying the thread 304 issuing the request, a core ID identifying the core 200 issuing the request, and a socket ID identifying the socket issuing the request. In other embodiments omitting multiple sockets, the source tag may include, for example, only a thread ID and a core ID.

Instead of providing a polling register for communicating processing completion, each hardware unit 300 includes a set of pointers 310 that are utilized to determine a unique location in real address space 312 of a completion granule (e.g., a byte) for each combination of thread 304 and hardware unit 300. In the illustrated example, real address space 312 includes a contiguous range of real addresses forming the socket completion area 314a for the threads of socket 0 and another contiguous range of real addresses forming the socket completion area 314b for the threads of socket 1. Within each socket completion area 314, a respective core completion area 316a-316p is implemented for each core 200, and within that core completion area 316, a separate thread completion area 318a to 318k is implemented for each respective thread 304. Each thread completion area 318 in turn includes a respective completion granule 320 for each of hardware units 300 (e.g., Ua 320 for hardware unit 300a and Um 320 for hardware unit 300m). In one preferred embodiment, each thread completion area 318 is made private to the associated thread 304, for example, by hypervisor-managed memory protection settings maintained in an unillustrated page table. It will be appreciated that, with the in-memory completion area data structure, each thread 304 can have as many requests simultaneously outstanding as it has associated completion granules.

In some embodiments, each pointer 310 has a one-to-one correspondence with a respective one of threads 304 in data processing system 100 and accordingly points directly to the thread completion area 318 for the associated thread 304. In other embodiments, pointers 310 may instead point to the base real addresses of the various core completion areas 316 or socket completion areas 314. For example, in an embodiment in which each pointer 310 points to the base real address of one of socket completion areas 314, a hardware unit 300 can compute the real address of a completion granule to be updated in response to completion of a request for a given thread 304 by adding to the base real address of the socket completion area 314 corresponding to the socket ID: (1) a core offset provided by the core ID, (2) a thread offset computed by multiplying the thread ID by the size in bytes of each thread completion area 318, and (3) a unit offset provided by the unit ID (which is configured in each hardware unit 300, for example, by the hypervisor). Again, the precise manner in which the real address of the completion granule is determined can vary between embodiments, but the real address of the completion granule for a request 306 is preferably determined by hardware unit 300 arithmetically based on at least the source tag of the request 306 and the relevant one of the set of pointers 310.

Figure 4:
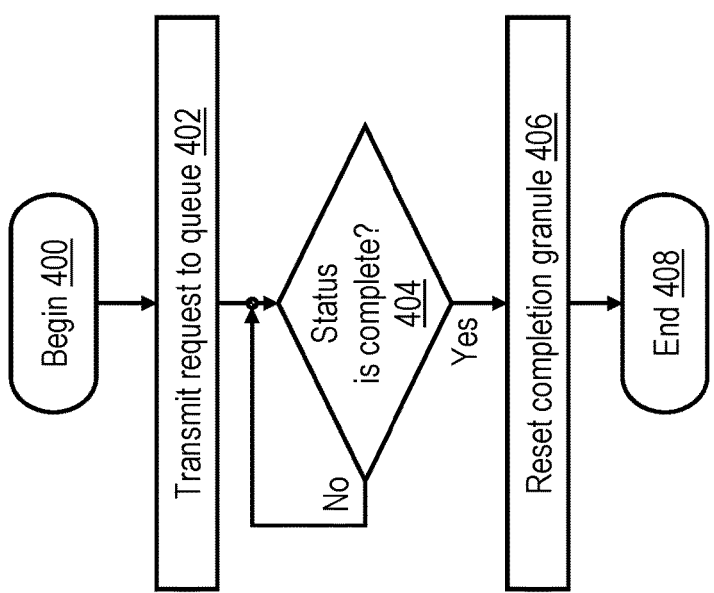
FIG. 4 is a high-level logical flowchart of an exemplary method by which a processor core manages an asynchronous request and its associated completion notification in accordance with one embodiment.
Figure 6:
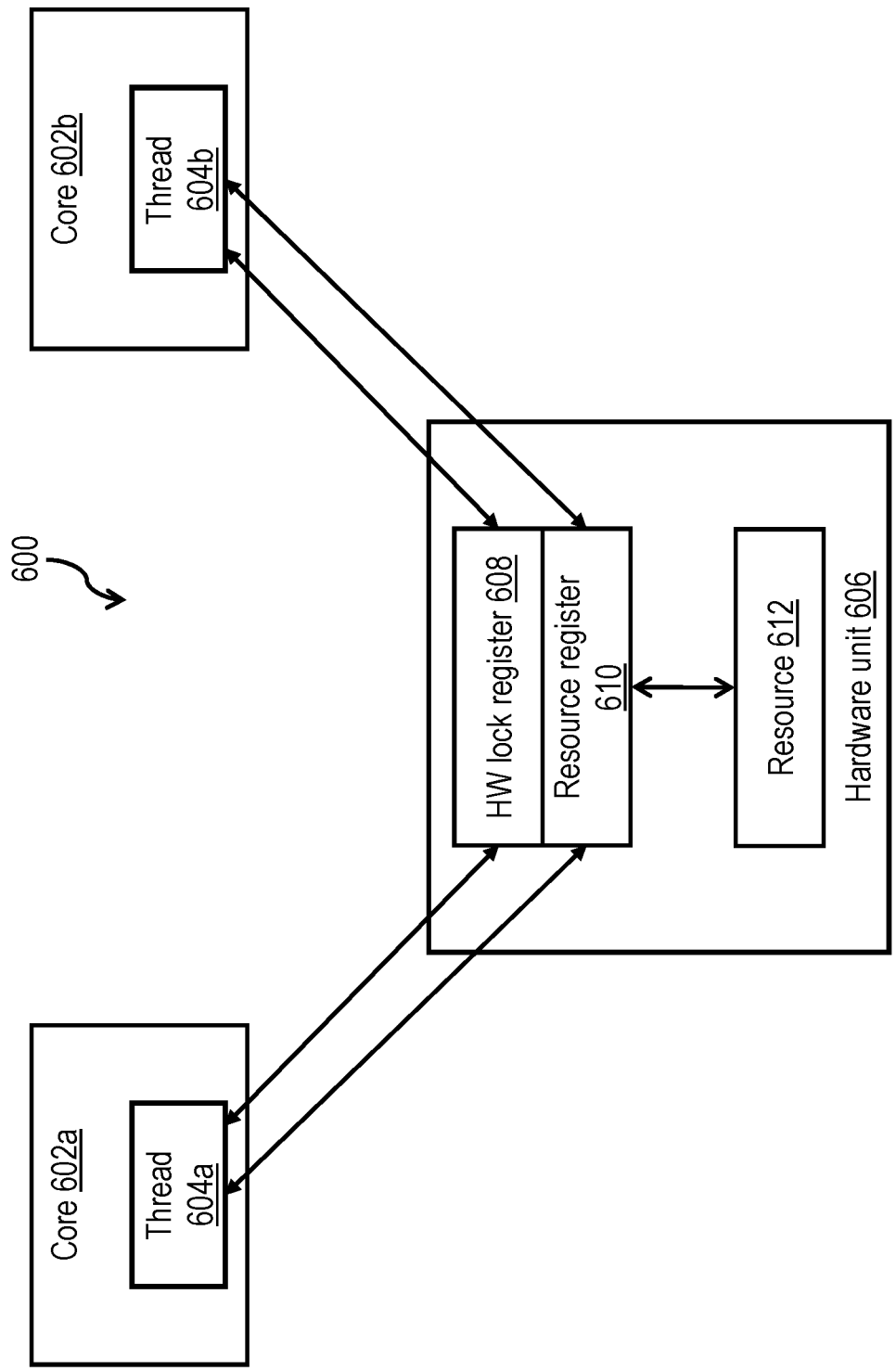
FIG. 6 is a block diagram of a prior art data processing system providing asynchronous notification of processing completion through a hardware lock register.

Referring now to FIG. 4, there is depicted a high-level logical flowchart of an exemplary method by which a processor core manages an asynchronous request and its associated completion notification in accordance with one embodiment. It should be understood that a given thread 304 may execute multiple instances of the illustrated process concurrently.

In the illustrated embodiment, the process begins at block 400 and then proceeds to block 402, which illustrates a physical thread 304 of one of cores 200 transmitting a request to one of hardware units 300a-300m for processing, for example, via memory I/O bus 210. The request includes or is accompanied by a source tag specifying the thread ID, the core ID, and, if applicable, the socket ID of the requesting thread 304. The request is accepted by the target hardware unit 300 and enqueued in input queue 308 as long as a free slot is available in input queue 308.

After issuing its request, thread 304 begins to periodically poll its associated completion granule in real address space 312 to determine whether or not the hardware unit 300 handling the request has updated the value of the completion granule to a provide a completion notification (block 404). If not, the process of FIG. 4 continues to iterate at block 404. If, however, thread 304 determines at block 404 that the value of the completion granule provides a completion notification, thread 304 writes the completion granule to clear or reset the value of the completion granule, thus preparing it for reuse (block 406). Thereafter, the process of FIG. 4 ends at block 408.

Figure 5:
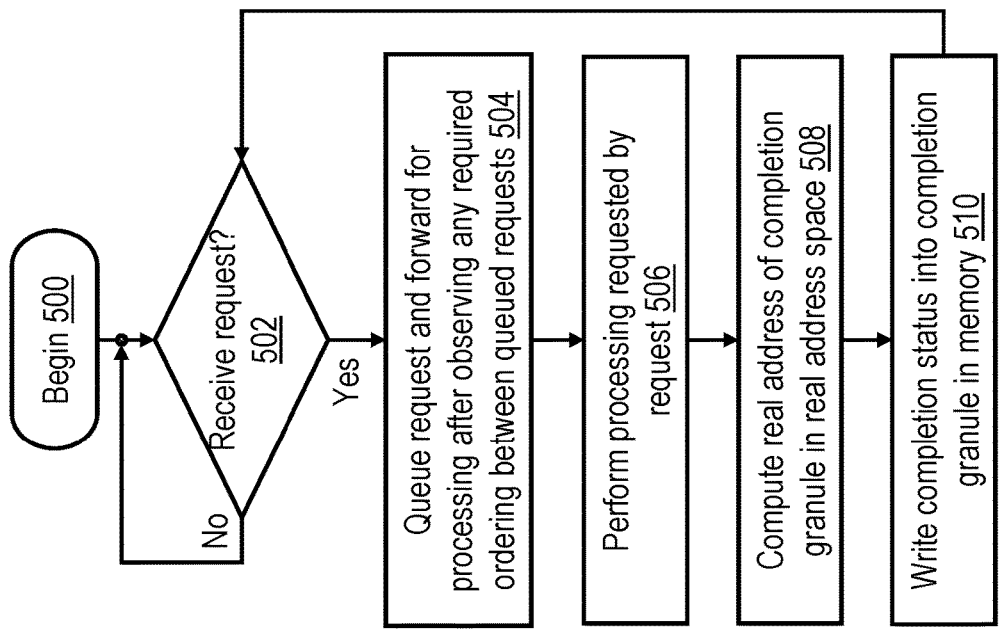
FIG. 5 is a high-level logical flowchart of an exemplary method by which a hardware unit provides an asynchronous completion notification to a processor core in accordance with one embodiment.

Referring now to FIG. 5, there is depicted a high-level logical flowchart of an exemplary method by which a hardware unit 300 provides an asynchronous completion notification to a thread 304 of a processor core in accordance with one embodiment. It should be understood that a given hardware unit 300 may execute multiple instances of the illustrated process concurrently.

The process of FIG. 5 begins at block 500 and then proceeds to block 502, which illustrates a hardware unit 300 determining whether or not a request for processing has been received from a thread 304 of one of cores 200. If not, the process of FIG. 5 iterates at block 502. If, however, a request for processing has been received by the hardware unit 300 from one of threads 304, hardware unit 300 enqueues the request 306 in input queue 308, ordering the request 306 with requests of zero or more other threads 304. As noted above, request 306 includes or is associated with a source tag specifying, for example, the thread ID, core ID, and, if applicable, socket ID of the requesting thread 304.

As other requests, if any, are removed from input queue 308, hardware unit 300 forwards request 306 and its source tag to processing element 302 for processing, possibly after enforcing any required ordering between request 306 and other request(s) buffered in input queue 308 (block 504). At block 506, processing element 302 performs the processing requested by request 306, for example, by enforcing a barrier with respect to other queued requests or killing an entry in a cache. In addition, at block 508, hardware unit 300 computes the real address of the relevant completion granule in real address space 312 based on the relevant one of pointers 310 and the source tag of the request 306. Finally, hardware unit 300 writes a value representing a completion status for the request 306 into the completion granule whose real address was determined at block 506. In at least some embodiments, hardware unit 300 writes the completion status by issuing a cache inject write request, which causes the value representing completion status to be written directly into a cache of the core 200 that issued the request. As a consequence, the polling reads of the requesting thread 304 illustrated at block 404 of FIG. 4 can be satisfied directly from local cache, thus avoiding the latency and resource utilization associated with repetitively polling a location in a system memory 108. Following block 510, the process of FIG. 5 returns to block 502, which has been described.

In at least one embodiment, asynchronous completion notification is provided in a data processing system including one or more cores each executing one or more threads. A hardware unit of the data processing system receives and enqueues a request for processing and a source tag indicating at least a thread and core that issued the request. The hardware unit maintains a pointer to a completion area in a memory space. The completion area includes a completion granule for the hardware unit and thread. The hardware unit performs the processing requested by the request and computes an address of the completion granule based on the pointer and the source tag. The hardware unit then provides completion notification for the request by updating the completion granule with a value indicating a completion status.

In the flow charts above, the methods depicted in the figures may be embodied in a computer-readable medium as one or more design files. In some implementations, certain steps of the methods may be combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be appreciated by one skilled in the art, aspects of the present invention may be embodied as a system, method or computer program product. Accordingly, aspects of the present invention may take the form of an entirely hardware embodiment or an embodiment combining software and hardware aspects that may all generally be referred to herein as a "circuit," "module," or "system."

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing, but does not include a computer-readable signal medium. More specific examples (a non-exhaustive list) of the computer-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer-readable storage medium may be any tangible storage medium that can contain, or store a program for use by or in connection with an instruction execution system, apparatus, or device.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of asynchronous completion notification in a data processing system including one or more cores each capable of executing one or more threads and a plurality of hardware units configured to service requests of the threads, the method comprising:
   at a hardware unit among the plurality of hardware units in the data processing system, receiving and enqueuing a request for processing and a source tag indicating at least a particular thread and particular core that issued the request;
   in a shared memory space accessible to all of the plurality of hardware units, maintaining a completion area including a plurality of completion granules each providing completion notification for requests for a respective unique combination of hardware unit and thread;
   storing in the hardware unit a pointer to the completion area in the shared memory space;
   based on receiving the request, performing, by the hardware unit, processing requested by the request; and
   the hardware unit providing asynchronous completion notification for the request by updating, with a value indicating a completion status, a particular completion granule among the plurality of completion granules based on the pointer and the source tag of the request.

2. The method of claim 1, wherein updating the particular completion granule includes the hardware unit issuing a cache injection request that writes the value into a cache in the particular core that issued the request.

3. The method of claim 1, wherein:
   the completion area has multiple portions each associated with a respective one of the multiple threads; and
   the pointer indicates a base address of a portion of the completion area associated with the particular thread.

4. The method of claim 1, wherein:
   the completion area has multiple portions each associated with a respective one of multiple cores; and
   the pointer indicates a base address of a portion of the completion area associated with the particular core.

5. The method of claim 1, wherein:
   the completion area has multiple portions each associated with a respective one of multiple sockets for hosting cores; and
   the pointer indicates a base address of a portion of the completion area associated with a socket hosting the particular core.

6. The method of claim 1, wherein:
   the hardware unit is a first hardware unit having an associated first unit offset;
   the data processing system includes a second hardware unit having a different associated second unit offset; and
   the updating includes updating the completion granule based on the pointer, the source tag, and the first unit offset.

7. A data processing system, comprising:
   one or more cores configured to execute one or more of multiple threads;
   a memory including a shared memory space accessible to all of a plurality of hardware units, wherein the shared memory space includes a completion area including a plurality of completion granules each providing completion notification for requests for a respective unique combination of hardware unit and thread;
   the plurality of hardware units communicatively coupled to the one or more cores and to the shared memory and configured to service requests of the threads, wherein a hardware unit among the plurality of hardware units includes an input queue and a processing element, and wherein the hardware unit is configured to perform:
  receiving and enqueuing within the input queue a request for processing and a source tag indicating at least a particular thread and particular core that issued the request;
  storing in the hardware unit a pointer to the completion area in the shared memory space, wherein the completion area includes a completion granule for the hardware unit and thread;
  based on receiving the request, performing processing requested by the request in the processing element; and
  providing asynchronous completion notification for the request by the hardware unit updating, with a value indicating a completion status, a particular completion granule among the plurality of completion granules based on the pointer and the source tag of the request.

8. The data processing system of claim 7, wherein updating the particular completion granule includes the hardware unit issuing a cache injection request that writes the value into a cache in the particular core that issued the request.

9. The data processing system of claim 7, wherein:
the completion area has multiple portions each associated with a respective one of the multiple threads; and
the pointer indicates a base address of a portion of the completion area associated with the particular thread.

10. The data processing system of claim 7, wherein:
the completion area has multiple portions each associated with a respective one of multiple cores; and
the pointer indicates a base address of a portion of the completion area associated with the particular core.

11. The data processing system of claim 7, wherein:
the completion area has multiple portions each associated with a respective one of multiple sockets for hosting cores; and
the pointer indicates a base address of a portion of the completion area associated with a socket hosting the particular core.

12. The data processing system of claim 7, wherein:
the hardware unit is a first hardware unit having an associated first unit offset;
the data processing system includes a second hardware unit having a different associated second unit offset; and
the updating includes updating the completion granule based on the pointer, the source tag, and the first unit offset.

13. The data processing system of claim 7, wherein the hardware unit comprises an interrupt controller.

14. A design structure tangibly embodied in a computer-readable storage device for designing, manufacturing, or testing an integrated circuit, wherein the design structure comprises:
  a hardware unit for a data processing system including one or more cores configured to execute one or more of multiple threads, wherein the hardware unit is configured to service requests of the threads, wherein the hardware unit includes an input queue and a processing element, and wherein the hardware unit is configured to perform:
    receiving and enqueuing within the input queue a request for processing and a source tag indicating at least a particular thread and particular core that issued the request;
    storing in the hardware unit a pointer to a completion area in a shared memory space accessible to multiple hardware units in the data processing system, wherein the completion area includes a plurality of completion granules each providing completion notification for requests for a respective unique combination of hardware unit and thread;
    based on receiving the request, performing processing requested by the request in the processing element; and
    providing asynchronous completion notification for the request by updating, with a value indicating a completion status, a particular completion granule among the plurality of completion granules based on the pointer and the source tag of the request.

15. The design structure of claim 14, wherein updating the particular completion granule includes the hardware unit issuing a cache injection request that writes the value into a cache in the particular core that issued the request.

16. The design structure of claim 14, wherein:
the completion area has multiple portions each associated with a respective one of the multiple threads; and
the pointer indicates a base address of a portion of the completion area associated with the particular thread.

17. The design structure of claim 14, wherein:
the completion area has multiple portions each associated with a respective one of multiple cores; and
the pointer indicates a base address of a portion of the completion area associated with the particular core.

18. The design structure of claim 14, wherein:
the completion area has multiple portions each associated with a respective one of multiple sockets for hosting cores; and
the pointer indicates a base address of a portion of the completion area associated with a socket hosting the particular core.

19. The design structure of claim 14, wherein:
the hardware unit is a first hardware unit having an associated first unit offset;
the data processing system includes a second hardware unit having a different associated second unit offset; and
the updating includes updating the completion granule based on the pointer, the source tag, and the first unit offset.

20. The design structure of claim 14, wherein the hardware unit comprises an interrupt controller.

\* \* \* \* \*